US005619386A

United States Patent [19]
Voorman et al.

[11] Patent Number: 5,619,386
[45] Date of Patent: Apr. 8, 1997

[54] ARRANGEMENT FOR READING INFORMATION FROM A TRACK ON A RECORD CARRIER COMPRISING A FAST SETTLING READ AMPLIFIER FOR MAGNETO-RESISTIVE HEADS

[75] Inventors: Johannes O. Voorman; Joao N. V. L. Ramalho, both of Eindhoven, Netherlands

[73] Assignee: U.S. Philips Corporation, New York, N.Y.

[21] Appl. No.: 318,420

[22] Filed: Oct. 5, 1994

[30] Foreign Application Priority Data

Oct. 6, 1993 [EP] European Pat. Off. ............... 93202836
Jun. 23, 1994 [EP] European Pat. Off. ............... 94201806

[51] Int. Cl.$^6$ ................. G11B 5/02; G11B 5/03; H03F 21/00
[52] U.S. Cl. .................. 360/67; 360/66; 330/60
[58] Field of Search ................. 360/46, 67, 66; 330/60

[56] References Cited

U.S. PATENT DOCUMENTS 5,270,882 12/1993 Jove et al. ................. 360/67

Primary Examiner—W. C. Kim
Attorney, Agent, or Firm—Richard A. Weiss

[57] ABSTRACT

An arrangement for reading out an information signal from a magnetic record carrier. The arrangement includes a read head having a magneto-resistive (MR) element ($R_{m1}$) with a first terminal (3) connected to a first point (13) of constant potential, and a second terminal (4); a bias-current generator (2) having an output (5) for supplying a bias-current to the MR element; and an amplifier circuit (1) having a first terminal (6) coupled to the output (5) of the bias-current generator (2), and a second terminal (7) coupled to the second terminal (4) of the magneto-resistive element ($R_{m1}$) so as to form a series arrangement of the bias-current generator, the amplifier circuit and the magneto-resistive element. At an output terminal (8), the information signal is available. The amplifier circuit (1) includes a MOS transistor $T_1$ coupled between the output terminal (8) and the second terminal (7), and a feedback circuit, including a resistor ($R_1$) and a capacitor ($C_1$), having a low cut-off frequency ($R_1, C_1$) which provides a bias voltage to the gate of the MOS transistor ($T_1$) and forces the bias-current of the bias-current generator (2) to flow through the MR element. Fast settling of the arrangement is possible by short-circuiting, via a switch ($S_1$), the resistor ($R_1$), a high charge current for capacitor $C_1$ being supplied by a buffer amplifier (310). The buffer amplifier (310), the resistor $R_1$ and the switch $S_1$ provide fast settling without generating undesired off-set.

28 Claims, 10 Drawing Sheets

ARRANGEMENT FOR READING INFORMATION FROM A TRACK ON A RECORD CARRIER COMPRISING A FAST SETTLING READ AMPLIFIER FOR MAGNETO-RESISTIVE HEADS

BACKGROUND OF THE INVENTION

1. Field of the Invention

The invention relates to an arrangement for reading out an information signal from a magnetic record carrier, comprising:

(a) a read head having a magneto-resistive element with a first terminal connected to a first point of constant potential and with a second terminal;

(b) a bias-current generator for supplying a bias-current; and (c) an amplifier circuit having (i) an output terminal for supplying the information signal, (ii) a first terminal coupled to the bias-current generator and to the output terminal, (iii) a second terminal coupled to the second terminal of the magneto-resistive element so as to form a series arrangement of the bias-current generator, the amplifier circuit and the magneto-resistive element between a second point of constant potential and the first point of constant potential, (iv) a first transistor, (v) a feedback circuit having an input terminal coupled to the output terminal of the amplifier circuit and having an output terminal, (vi) a load impedance and (vii) a capacitor element, a first main flow terminal of the first transistor being connected to the second terminal of the amplifier circuit, a second main flow terminal of the first transistor being coupled to the first terminal of the amplifier circuit, a control terminal of the first transistor being coupled to the output terminal of the feedback circuit and to the first point of constant potential via at least the capacitor element, and the load impedance being coupled to the output terminal of the amplifier circuit.

2. Description of the Related Art

Such an arrangement is known from U.S. Pat. No. 5,270,882. In this known arrangement, current biasing and current sensing of the magneto-resistive (MR) element is combined, thereby providing a low-noise amplification. Read heads with MR elements and thin film inductive write heads, mounted on arms, are used in mass storage devices such as disk drives. Disk drives are equipped with multiple platters, each side of which is used for writing and reading the information. In modern systems, servo patterns are embedded in radial patterns between the data on the disk. Writing of data is interchanged with reading to remain on track. Read-to-write and write-to-read transient times should be as short as possible. The capacitor element and the feedback circuit in the known arrangement provide a low bandwidth and, therefore, the transient response time is intrinsically long.

An approach to realize short transient times is to leave the read amplifier powered during writing. This, however, results in a loss of extra power. Moreover, crosstalk from the write drivers to the read amplifiers will influence the DC settings of the read amplifiers. The DC-offset caused by the crosstalk is amplified in the read amplifier and may overload the output stages thereof. Similar problems are encountered when the information on the platters is arranged in "cylinders". During reading, the system switches from platter to platter without mechanical delay introduced by repositioning of the armstack. To avoid electrical delays, head switching should be fast. Powering a read amplifier for each read head is not attractive, in particular, in battery operated portable equipment. A second option is to use only one read amplifier and to switch the individual read heads in circuit connection with the read amplifier.

Applying this technique to the known arrangement would seriously limit the speed of switching between the different MR elements. MR elements have large spread in resistance and bias current settings. After each head change, the capacitor element in the amplifier circuit has to be charged or discharged to the new desired voltage. However, in order to obtain a sufficiently low cut-off frequency of the feedback circuit, the DC resistance of the feedback circuit should be high. A typical cut-off frequency is 10 KHz. In the known arrangement, the feedback circuit is a transconductance stage having a low transconductance Gm. The maximum output current of such a transconductance stage severely limits the speed of charging and discharging of the capacitor element and gives rise to transients with a duration of hundreds of microseconds. This is too long for fast mass storage devices. In the known arrangement, the transductance Gm of the transconductance stage is temporarily increased by increasing its bias current. This, however, causes unacceptable errors because of increased offset of the transconductance stage.

SUMMARY OF THE INVENTION

It is an object of the invention to provide a fast settling feedback circuit for use in the known arrangement. In accordance with an aspect of the invention, the known arrangement is characterized in that the feedback circuit comprises:

(a) a voltage buffer having an input coupled to the input terminal of the feedback circuit and having an output;

(b) a first series resistor connected between the output of the voltage buffer and the output terminal of the feedback circuit; and (c) a switch connected in parallel with the first series resistor and operable in response to a control signal.

The voltage buffer provides the high currents needed to charge or discharge the capacitor element when the series resistor is short circuited by the switch connected in parallel to the series resistor. Only a passive element, i.e., a bias current free element, is short circuited, and no offset is created by the short circuiting. In this way, a very fast settling is possible without loosing the desired accuracy in settling of the read amplifier.

A first fast settling arrangement is characterized in that the voltage buffer comprises a first current source, a second current source, a diode connected second transistor and a third transistor, a first main flow terminal of the second transistor and a first main flow terminal of the third transistor being interconnected and coupled to the first point of constant potential via the first current source, a second main flow terminal of the second transistor being coupled to the second point of constant potential via the second current source and forming the output of the voltage buffer, a second main flow terminal of the third transistor being coupled to the second point of constant potential and a control terminal of the third transistor forming the input of the voltage buffer and being coupled to the input terminal of the feedback circuit.

The voltage buffer provides a voltage drop across the first and second terminals of the amplifier which is as small as possible and accurately known. As a result, the voltage drop across the bias-current generator can be made as large as possible within the available supply voltage. This provides the possibility to design a bias-current source having low noise.

The current that can be sunk by the first current source limits the discharging time of the capacitor element. To improve the settling speed, the arrangement may be further characterized in that the voltage buffer further comprises a third current source connected between the second main flow terminal of the third transistor and the second point of constant potential, and the first current source comprises a diode arrangement, a bias resistor and a fourth transistor having a first main flow terminal connected to the first point of constant potential, a second main flow terminal connected to first main flow terminals of the second and third transistors and a control terminal coupled to the second main flow terminal of the third transistor via the diode arrangement and to the first point of constant potential via the bias resistor. The fourth transistor can sink currents which are up to two orders of magnitude larger than the current through the third current source.

The charging time of the capacitor element can be shortened in an arrangement which is characterized in that the voltage buffer further comprises a diode element; a fifth transistor having a control terminal and a second main flow terminal interconnected and coupled to the third current source via the diode element, and a first main flow terminal connected to the first main flow terminal of the second transistor; and a sixth transistor having a first main flow terminal coupled to the second main flow terminal of the second transistor, a second main flow terminal coupled to the second point of constant potential and a control terminal coupled to the second main flow terminal of the fifth transistor via the diode element. The additional components provide a class A/B low-ohmic high-current output buffer circuit for quickly charging the capacitor element via the sixth transistor during settling.

Another preferred fast settling arrangement is characterized in that the first terminal of the amplifier circuit is coupled to the output terminal of the amplifier circuit via a second transistor having a first main flow terminal connected to the first terminal of the amplifier circuit and a second main flow terminal coupled to the output terminal of the amplifier circuit; and the voltage buffer comprises:

(a) a current mirror having an input terminal and an output terminal;

(b) a third transistor having a conductivity opposite to the conductivity of the second transistor and having a first main flow terminal coupled to the output terminal of the current mirror and a control terminal connected to receive a reference voltage;

(c) a second series resistor connected between the first main flow terminal of the third transistor and the output terminal of the amplifier circuit;

(d) a diode connected fourth transistor of the same type as the first transistor, and having a first main flow terminal connected to the first main flow terminal of the first transistor and a second main flow terminal coupled to a second main flow terminal of the third transistor;

(e) a fifth transistor of the same type as the first transistor, and having a control terminal and a first main flow terminal connected to the corresponding terminals of the first transistor and a second main flow terminal coupled to the input terminal of the current mirror; and (f) a buffer amplifier having an input connected to the control terminal of the fourth transistor and an output connected to the first series resistor.

In order to obtain low noise, the first transistor should be large. By cascoding this large transistor with the second transistor the following advantages are obtained. The large first transistor and the bias-current generator can have a low output impedance, since they feed their respective currents into a very low-ohmic first main flow terminal of the second transistor. The capacitance between the second main flow terminal and the control terminal of the large first transistor is not Millered. The bias-current generator provides lower bias-current and a corresponding lower noise because part of the total bias-current for the magneto-resistive element is provided by the parallel arranged second transistor. The bias-current generator feeds current to a low voltage node, so that a maximum voltage range is available for the bias-current source, thus enabling the bias-current generator to be optimal for low noise. After settling, the current through the second series resistor is zero, and the current through the second transistor can be adjusted by means of a voltage applied to the control terminal of the third transistor.

Nevertheless, an inaccuracy still exists which is caused by charge injection of the switch which short-circuits the first series resistor. After settling is finished, the switch is opened and some capacitive charge is extracted from the capacitor element. This charge is about equal to half the charge in the channel of the switching transistor. This charge extraction can be compensated conventionally by switching a small capacitor which is connected to the capacitor element to the second point of constant potential. However, this causes crosstalk from the power supply voltage to the capacitor element. To avoid these problems, the arrangement is characterized in that the switch comprises: first and second switching transistors of a first conductivity type, a first main flow terminal of the first switching transistor being connected to a second main flow terminal of the second switching transistor, and a second main flow terminal of the first switching transistor being connected to a first main flow terminal of the second switching transistor; first and second driver transistors of a second conductivity type, first main flow terminals of the first and second drive transistors being connected to a supply voltage terminal, control terminals of the first and second driver transistors being connected to a control input for receiving the control signal, a second main flow terminal of the first driver transistor being connected to the control terminal of the first switching transistor, and a second main flow terminal of the second driver transistor being connected to the control terminal of the second switching transistor; and third and fourth driver transistors of the first conductivity type having control terminals connected to the control input, a first main flow terminal of the third driver transistor being connected to the second main flow terminal of the first switching transistor, a first main flow terminal of the fourth driver transistor being connected to the second main flow terminal of the second switching transistor, a second main flow terminal of the third driver transistor being connected to the second main flow terminal of the first driver transistor, and a second main flow terminal of the fourth driver transistor being connected to the second main flow terminal of the second driver transistor. This switch arrangement fees half of the total channel charge of the first and second switching transistors back to the capacitor element and compensates for the extraction of charge from the capacitor element.

All embodiments may be used in dual construction in combination with one or two MR elements. In the latter case, two elements read the same data track from the record carrier and the non-linearities of the MR elements cancel each other. In the case of two MR elements, the noise contribution of the first transistors can be reduced further by coupling the capacitor element of the amplifier circuit of the first arrangement to the second terminal of the amplifier circuit of the second arrangement, and the capacitor element of the amplifier circuit of the second arrangement to the second terminal of the amplifier circuit of the first arrangement. The capacitor elements are cross-coupled to the second terminals of the individual amplifiers instead of to ground. The cross-coupling causes a shunting of the noise resistances of the first transistors and effects a reduced noise voltage contribution of the first transistors.

BRIEF DESCRIPTION OF THE DRAWINGS

The above and other features and advantages of the invention will be apparent from the following description of exemplary embodiments of the invention with reference to the accompanying drawings, in which.

Like reference symbols are employed in the drawings and in the description of the preferred embodiments to represent the same or very similar item or items.

DETAILED DESCRIPTION OF THE PREFERRED EMBODIMENTS

Figure 1:
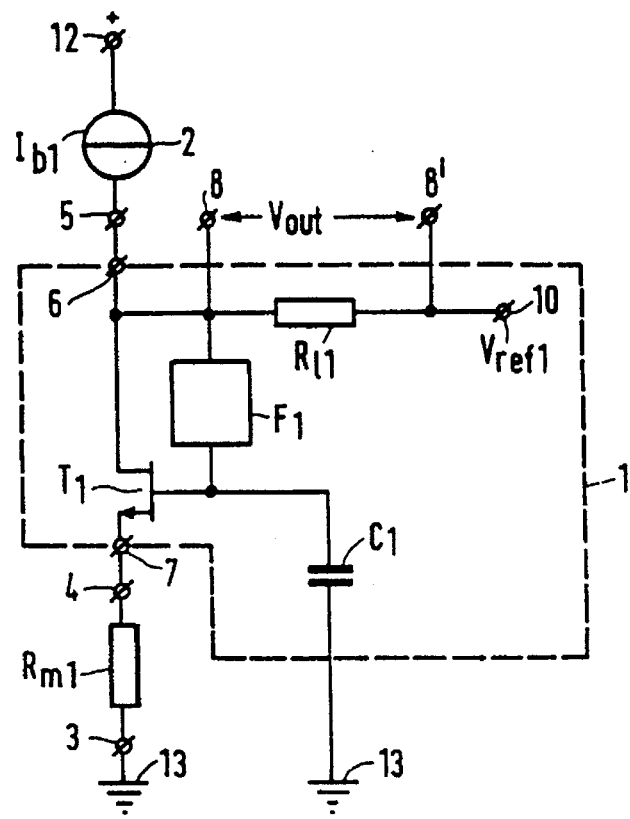
FIG. 1 shows a known arrangement for reading information from a track on a record carrier.

FIG. 1 shows the basic circuit construction of the arrangement known from U.S. Pat. No. 5,270,882, which comprises a read head (not shown) having a magneto-resistive (MR) element $R_{m1}$, a bias-current generator 2 for generating a bias-current $I_{b1}$ and an amplifier circuit 1. A first terminal 3 of the magneto-resistive element $R_{m1}$ is connected to a first point of constant potential 13, which is ground potential. An output 5 of the bias-current generator 2 is coupled to a first terminal 6 of the amplifier circuit 1. A second terminal of the bias-current generator 2 is coupled to a second point of constant potential 12 (the positive supply voltage, denoted by +). A second terminal 7 of the amplifier circuit 1 is coupled to a second terminal 4 of the magneto-resistive element $R_{m1}$. An output terminal 8,8' is available for supplying the information signal read out.

The amplifier circuit 1 comprises a transistor $T_1$, a feedback circuit $F_1$ and a capacitor element $C_1$. The transistor $T_1$ is in the form of a MOSFET or a jFET. Its source terminal is coupled to the second terminal 7 of the amplifier circuit 1. Its drain terminal is coupled to the first terminal of the amplifier circuit 1. Its gate terminal is coupled to the point of constant potential 13, via the capacitor element $C_1$. Further, the feedback circuit $F_1$ is coupled between the gate of the transistor $T_1$ and the terminal 6 of the amplifier circuit 1. The drain terminal of the transistor $T_1$ is further coupled to a reference point 10 via a load impedance $R_1$. At the reference point 10, a voltage $V_{ref}$ is available, which needs not be a constant potential, but may vary, as will be explained later. At output terminal 8,8' the voltage occurring over the load impedance $R_1$ is present. The bias-current generator 2, the amplifier circuit 1, more specifically the transistor $T_1$ in the amplifier circuit 1, and the MR element $R_{m1}$ form a series arrangement between the terminals 3 and 12.

As can be seen from the figure, the MR element $R_{m1}$ is connected to ground via its terminal 3. Further, when used in an arrangement for reading an information signal from a disk shaped record carrier (not shown), the disk is also preferably electrically connected to ground. This limits the possibility that a voltage difference can be built up between the head and the disk. This avoids electrical discharges that could otherwise occur between head and disk, which discharges could damage the head.

As previously stated, the MR element $R_{m1}$, the amplifier 1 and the bias-current generator 2 form a series arrangement between the two (supply) terminals 3 and 12. Thus, the current supplied by the bias-current generator 2 is fed to the MR element $R_{m1}$ so as to bias the MR element, as well as to the amplifier circuit 1. This bias current through the amplifier circuit 1 results in a certain noise contribution, which is lower when the current through the amplifier circuit is higher. If the amplifier circuit 1 were in parallel with the MR element $R_{m1}$ and the bias-current generator 2, a larger current would be needed to bias the MR element and to supply the input stage of the amplifier circuit with the current needed to obtain a low noise contribution in the amplifier circuit. Thus, the arrangement of FIG. 1 produces less noise and requires less bias current, which is a major advantage in the case of battery powered supply voltages.

When the amplifier circuit 1 has only one transistor, such as in the embodiment of FIG. 1, instead of two in the case of a long-tailed pair, the amplifier circuit has a lower noise contribution.

Variations in the magnetic field detected by the MR element $R_{m1}$ lead to variations in the resistance value of the MR element. The gate of transistor $T_1$ is coupled to ground for AC signals by means of the capacitor $C_1$. This means that for AC signals, the terminal 4 of the MR element $R_{m1}$ lies virtually to ground. As a result of this, variations in the resistance value of the MR element can only lead to variations in the current through the series arrangement. These current variations are fed via the load impedance $R_{l1}$ to the terminal 10, and lead to a voltage variation across the load impedance $R_{l1}$. This voltage variation is detected at the terminals 8,8' as the output signal of the amplifier circuit 1.

The feedback circuit $F_1$ realizes a low cut-off frequency. In order to enable integration of the capacitor $C_1$, the resistance value of $F_1$ should be high. This results in the transistor $T_1$ acting like a diode for DC signals, so that the bias-current $I_{b1}$ can be fed to the MR element $R_{m1}$. The feedback circuit $F_1$ is an impedance network. In its most simple form, the feedback circuit $F_1$ can be a resistor.

In order to make the arrangement of FIG. 1 suitable for use at low supply voltages applied between the terminals 3 and 12, it is necessary to make the voltage drop between the terminals 4 and 6 as small as possible, so that a maximum voltage range is available for the bias-current source 2, so as to enable the bias-current source to be optimal for low noise.

Figure 2A:
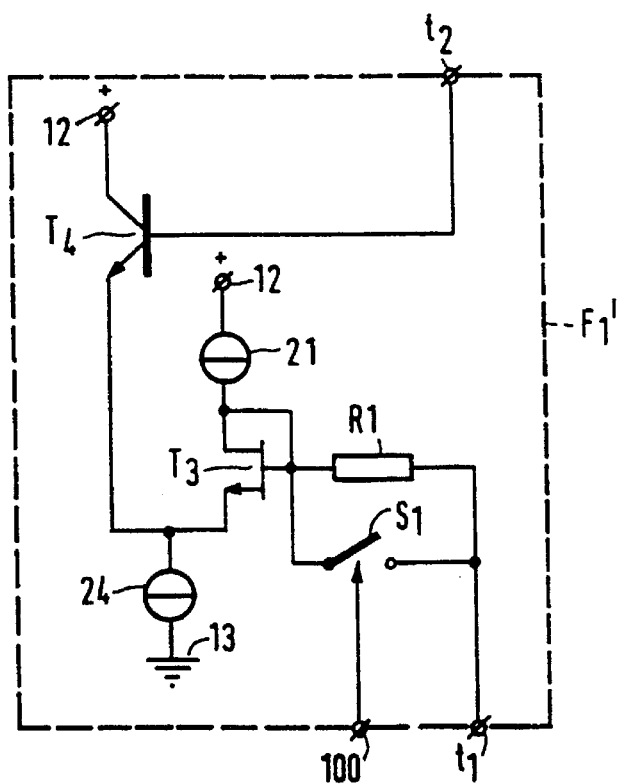
FIGS. 2A, 2B, 2C show versions of a feedback circuit for use in the arrangement of FIG. 1.

FIG. 2A shows an elaborated version of the feedback circuit $F_1$, feedback circuit $F_1'$, so as to make it high ohmic and to realize a voltage drop across the transistor $T_1$ which is as small as possible. The feedback circuit $F_1'$ comprises a transistor $T_3$, which is a MOS transistor, a bipolar transistor $T_4$ and a resistor $R_1$. Both transistors $T_1$ and $T_3$ are of the same type, MOSFET or jFET. The gate terminal of the transistor $T_1$ is coupled to the terminal $t_1$ of the feedback circuit $F_1'$. The terminal $t_1$ is coupled to the gate terminal of the third transistor $T_3$ via the resistor $R_1$. The source terminal of the third transistor $T_3$ is coupled to the emitter terminal of the fourth transistor $T_4$. The base terminal of the transistor $T_4$ is coupled to the terminal $t_2$ of the feedback circuit $F_1'$, which terminal is coupled to the terminal 6 of the amplifier circuit 1. The gate and drain terminals of the transistor $T_3$ are interconnected so as to form a diode. Further, the interconnected gate and drain terminals are coupled to the point 12 of constant potential via a current source 21. The emitter of the transistor $T_4$ is coupled to the point of constant potential 13 via a current source 24. Further, the collector of the transistor $T_4$ is coupled to the point of constant potential 12. The current sources provide current supply for their transistors $T_3$ and $T_4$.

By means of the feedback part of FIG. 2A, a voltage shift of $-V_{th}+V_d$ is obtained between the terminals $t_1$ and $t_2$, where $V_{th}$ is the threshold voltage of a MOS transistor, such as the transistors $T_1$ and $T_3$, and $V_d$ is the voltage across a bipolar diode. As a results, the voltage difference between the terminals 6 and 7 of the amplifier circuit 1 of FIG. 1 is roughly $V_d$, or substantially 0.7 V.

More specifically, the voltage difference between the terminals 6 and 7 is $V_d+V_{ch1}-V_{ch2}$, where $V_{ch1}$ and $V_{ch2}$ are the channel voltages of the transistors $T_1$ and $T_3$ respectively, which are dependent of the drain current through those transistors ($V_{ch}=V_{gs}-V_{th}$, where $V_{gs}$ is the gate-source voltage and $V_{th}$ is the threshold voltage of a transistor).

Further, the impedance formed by the feedback circuit $F_1^1$ between the terminals $t_1$ and $t_2$ is high-ohmic so as to obtain the desired low value for the cut-off frequency of the lower band edge of the frequency characteristic of the amplifier circuit 1. The circuit of FIG. 2A has current sources coupled to both the positive (12) and the negative (13) supply voltage terminals.

Figure 2B:
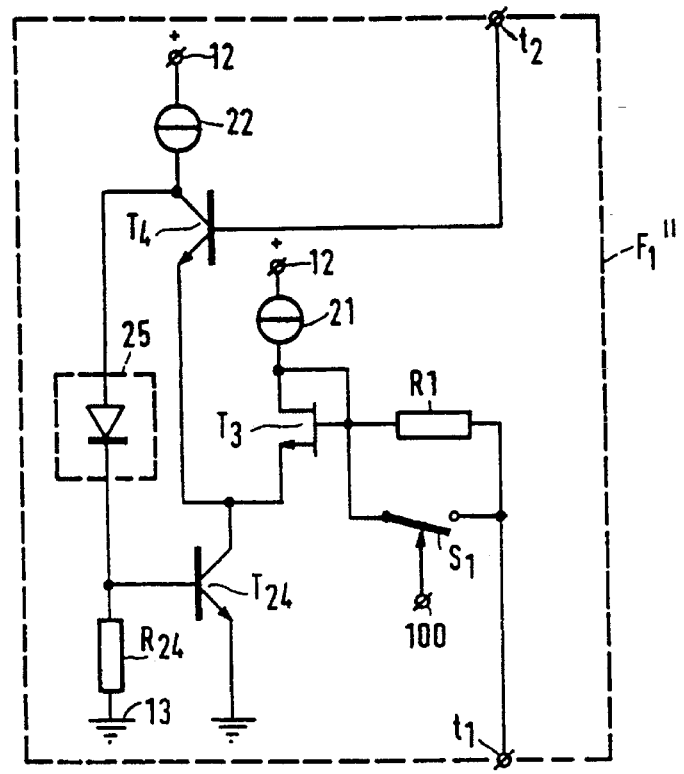

FIG. 2B shows a further elaborated version of the feedback circuit of FIG. 2A, feedback circuit $F_1''$, which has current sources connected to the positive supply terminal only. In addition to the elements included in the circuit of FIGS. 2A, except for the current source 24 (which is replaced by other elements as described hereinafter), the circuit of FIG. 2B further comprises a diode arrangement 25 of one or more diodes, a bipolar transistor $T_{24}$, a current source 22 and a resistor $R_{24}$. The current source 22 is coupled between the point 12 of constant potential and the collector of the transistor $T_4$, and is further coupled via the diode arrangement 25 to the base terminal of the transistor $T_{24}$. The base terminal of the transistor $T_{24}$ is also coupled to the point 13 of constant potential via the resistor $R_{24}$. The emitter of the transistor $T_{24}$ is also coupled to the point 13 of constant potential, and its collector is coupled to the interconnected emitter and source of the transistors $T_4$ and $T_3$ respectively. The circuit part formed by the elements 22, 25, $R_{24}$ and $T_{24}$ effectively replaces the current source 24 in FIG. 2A.

The circuits of the FIGS. 2A and 2B further show a switch $S_1$ connected in parallel to the resistor $R_1$. When activating the amplifier circuit 1 of FIG. 1, or when the current value through the MR element $R_{m1}$ should be changed, the capacitor $C_1$ must initially be charged (or discharged) so that the amplifier circuit can settle to the new situation. In order to settle fast, the resistor $R_1$ is short-circuited by the switch $S_1$ under the influence of a switching signal applied to the control signal input 100, so that the current for charging the capacitor $C_1$ can be supplied by the current source 21, or discharging can take place via the current source 24. Thus, the charging time of the capacitor $C_1$ is limited by the maximum current that can be supplied by the current source 21, and the discharging time is limited by the maximum current that can be received by the current source 24. Replacing the current source 24 of FIG. 2A by the elements 22, 25, $R_{24}$ and $T_{24}$ in FIG. 2B already offers a shortening of the discharge time, as the transistor $T_{24}$ can sink currents which are up to two orders of magnitude larger than the current through the current source 22.

Figure 2C:
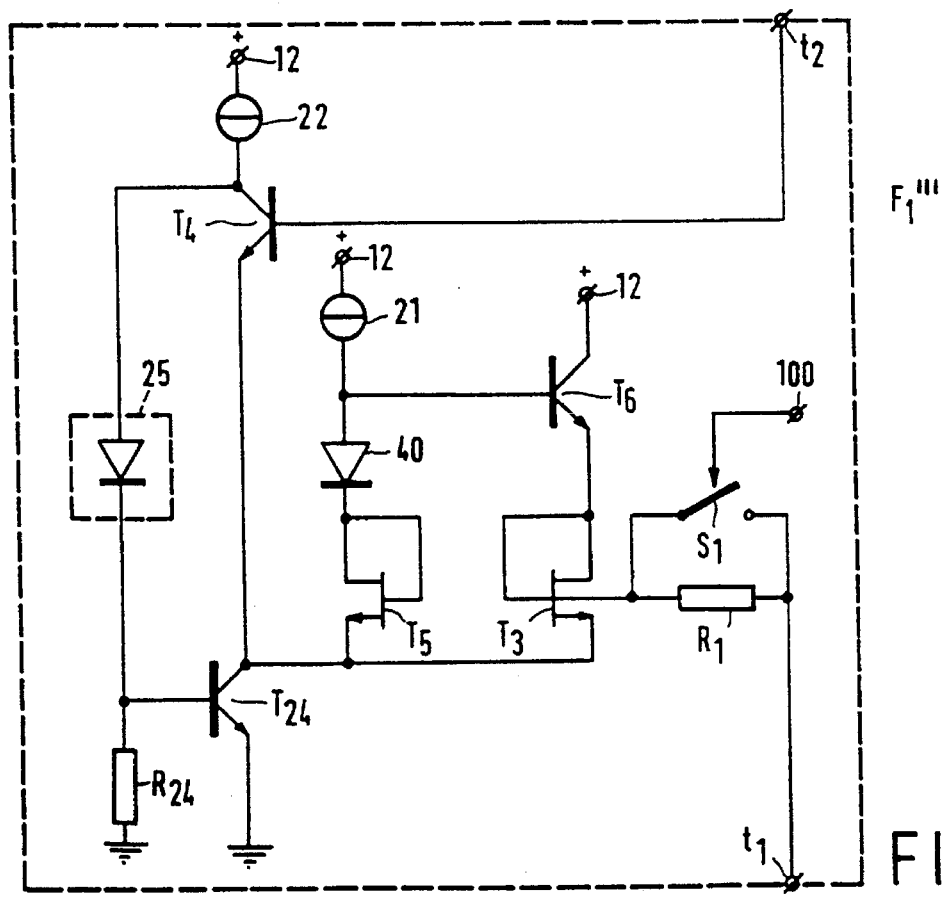

FIG. 2C shows a feedback circuit $F_1'''$ in which the charging time of the capacitor $C_1$ can be shortened. In addition to the elements included in the circuit of FIG. 2B, the circuit of FIG. 2C further comprises a MOS transistor $T_5$, a bipolar transistor $T_6$ and a bipolar diode element 40. The gate and drain terminals of the transistor $T_5$ are interconnected and both coupled to the current source 21 and to a base terminal of the transistor $T_6$ via the diode element 40. The source terminals of the transistors $T_3$ and $T_5$ are interconnected. A collector terminal of the transistor $T_6$ is coupled to point 12 of constant potential. An emitter terminal of the transistor $T_6$ is coupled to the interconnected gate and drain terminals of the transistor $T_3$. The circuit comprising the transistors $T_3$, $T_6$ and $T_5$ and the diode element 40 form a class-A/B circuit and provides a quicker charging of the capacitor element $C_1$ during initialisation of the arrangement by means of current supplied by the transistor $T_6$.

Figure 3A:
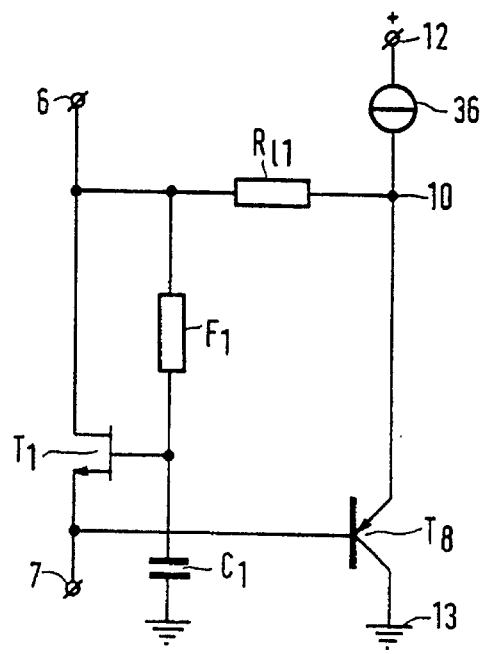
FIGS. 3A, 3B, 4A, 4B and 5 show versions of an amplifier circuit for use in the arrangement of FIG. 1.

FIG. 3A shows a further-elaborated version of the amplifier circuit 1 of FIG. 1. The circuit of FIG. 3A comprises a bipolar transistor $T_8$, which has its base terminal coupled to the source terminal of the transistor $T_1$, its collector to the point 13 of constant potential, and its emitter coupled to the reference point 10. Further a current source 36 is coupled between the reference point 10 and the second point 12 of constant potential. This circuit has the advantage that the DC voltage present at the reference point 10 follows the DC voltage present at the terminal 7 of the amplifier circuit. This means that voltage variations occurring across the MR element $R_{m1}$ do not appear across the load resistor $R_{l1}$.

The voltage difference between the terminals 7 and 10 is equal to $V_d$. If $F_1$ is one of the circuits of the FIGS. 2A, 2B or 2C, the voltage difference between the terminals 6 and 7 equals $V_d+V_{ch1}-V_{ch2}$, see above, so that the DC offset across the load resistor $R_{l1}$ is low ($V_{ch1}-V_{ch2}$). Only voltage variations in the transistor $T_1$, resulting from the current variations through the transistor $T_1$, still appear across the load resistor $R_{l1}$.

Figure 3B:
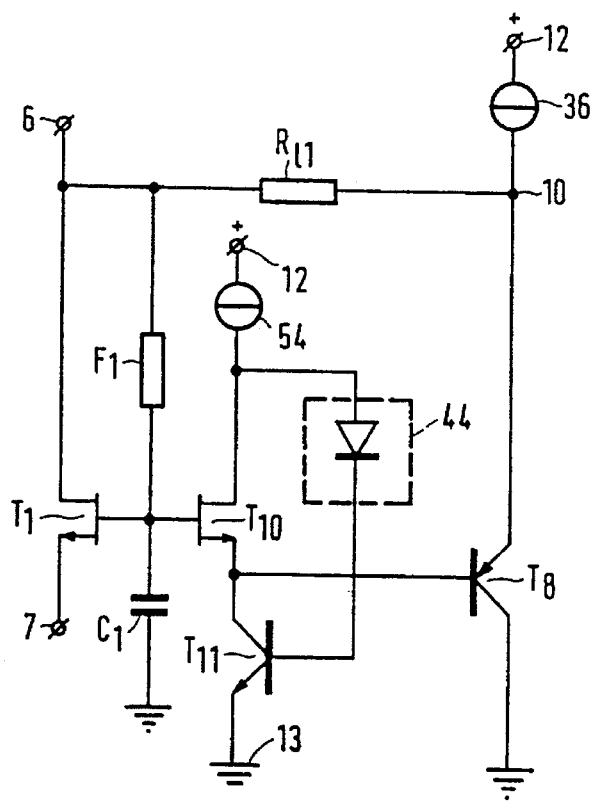

A further improvement of the amplifier circuit of FIG. 3A is disclosed in FIG. 3B. In addition to the elements included in the circuit of FIG. 3A, this amplifier circuit further has a MOS transistor $T_{10}$ and a bipolar transistor $T_{11}$. The gate of transistor $T_{10}$ is connected to the gate of the transistor $T_1$.

The drain of transistor $T_{10}$ is connected to the gate of the transistor $T_1$. The drain of transistor $T_{10}$ is coupled to the point 12 of constant potential via a current source 54, as well as coupled to the base of the transistor $T_{11}$ via a diode arrangement 44 having one or more series connected diodes. The source of the transistor $T_{10}$ is coupled to the collector of the transistor $T_{11}$, as well as to the base of the transistor $T_8$. The emitter of the transistor $T_{11}$ is coupled to the point 13 of constant potential.

The voltage difference between the gate of the transistor $T_1$ and the terminal 10 equals $V_{gs}-V_d$, where $V_{gs}$ is the gate-source voltage of the transistor $T_{10}$. If $F_1$ is again one of the circuits of the FIGS. 2A, 2B or 2C, the voltage difference between the gate of the transistor $T_1$ and terminal 6 equals $V_{gs}'-V_d$, where $V_{gs}'$ is the gate-source voltage of the transistor $T_3$. The voltage across the load resistor $R_{l1}$ now equals $V_{gs}'-V_{gs}$. If the current through transistor $T_{10}$ is made equal to the current through the transistor $T_3$, and further the transistors $T_{10}$ and $T_3$ have equal dimensions, the voltage across the load resistor $R_{l1}$ becomes practically zero, independent of the value of the MR bias current.

It will be clear that, instead of the combination of the current source 54, the diode arrangement 44 and the transistor $T_{11}$, a current source could have been coupled between the emitter of the transistor $T_{11}$ and ground potential.

Figure 4A:
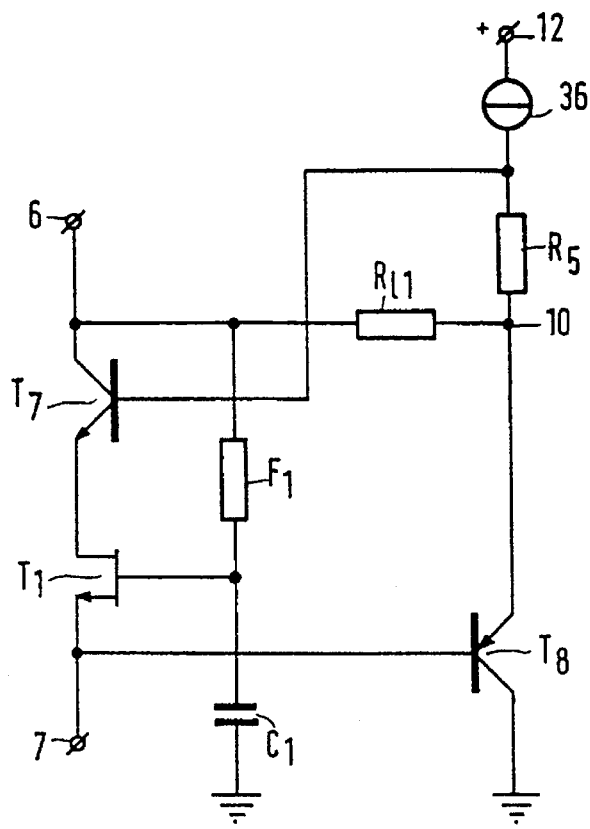

FIG. 4A shows a further improvement of the amplifier circuit of FIG. 3A. The amplifier circuit of FIG. 4A, in addition to the elements included in the circuit of FIG. 3A, comprises a bipolar transistor $T_7$ which is coupled between the drain terminal of the transistor $T_1$ and the terminal 6. The base terminal of transistor $T_7$ is coupled to the point 12 of constant potential via the current source 36, and to the point 10 via a resistor $R_5$. By means of the transistor $T_7$, the transistor $T_1$ is cascoded in order to get a higher output impedance at the terminal 6 and to prevent the Millering of the drain-gate capacitance of transistor $T_1$.

Figure 4B:
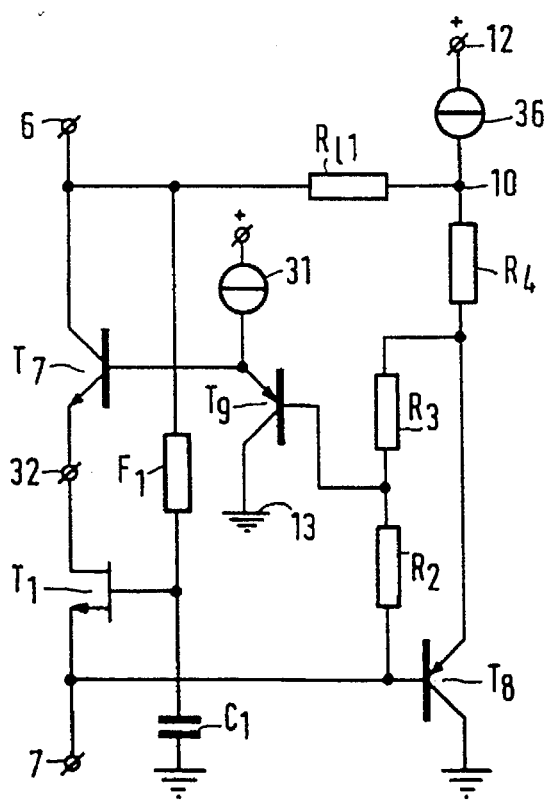

FIG. 4B shows an alternative of the amplifier circuit of FIG. 4A. It additionally comprises a transistor $T_9$, resistors $R_2$, $R_3$ and $R_4$ and a current source 31. The base terminal of the transistor $T_7$ is connected to an emitter terminal of the transistor $T_9$, whose base terminal is coupled to the source terminal of the transistor $T_1$ via the resistor $R_2$. The collector of the transistor $T_9$ is also coupled to the point 13 of constant potential. The emitter of the transistor $T_9$ is further coupled to the point 12 of constant potential via the current source 31. The base of the transistor $T_9$ is also coupled to the emitter of the transistor $T_8$ via the resistor $R_3$, and to the reference point 10 via the resistors $R_3$ and $R_4$.

Further, the construction of the transistors $T_7$ and $T_9$ provide a voltage at the interconnection node 32 of the emitter of transistor $T_7$ and the drain of transistor $T_1$ which is roughly half way between the voltages present on the terminals 7 and 6. This means that a voltage difference of $V_d/2$ is present between the node 32 and the terminal 7, and between the nodes 32 and the terminal 6, as the voltage difference between the terminals 6 and 7 is $V_d$, as explained previously.

It should be noted that FIG. 4A and FIG. 4B are derived from FIG. 3A by adding the cascode transistor $T_7$, using different biasing schemes. The same cascode principles can be added to the circuit of FIG. 3B.

Figure 5:
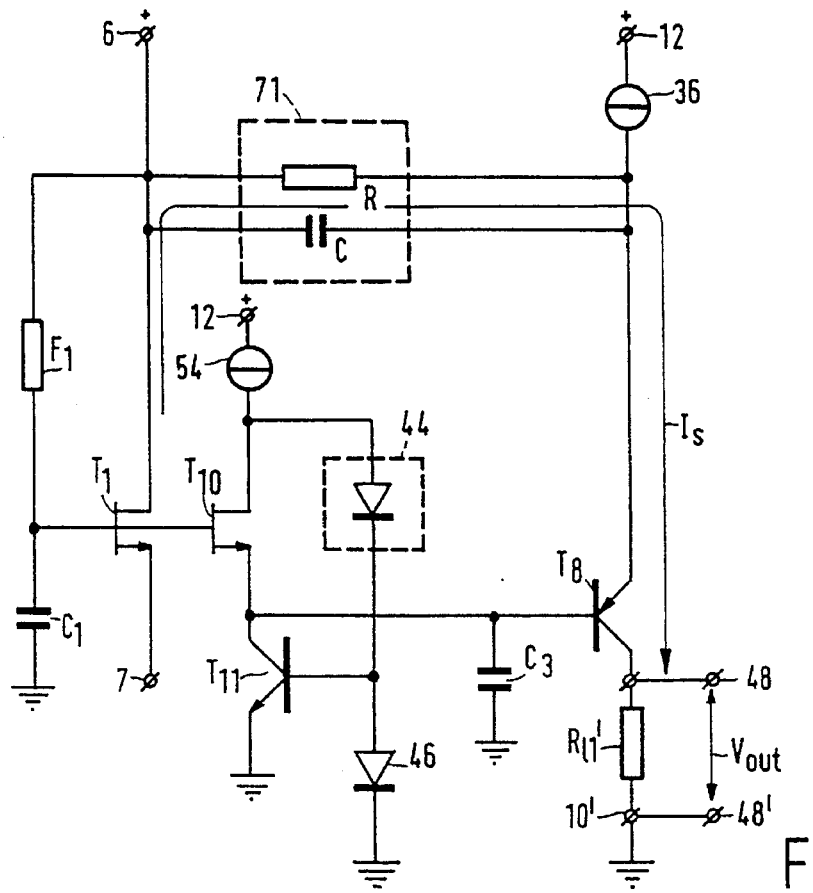

FIG. 5 shows another embodiment of the amplifier circuit. The amplifier circuit of FIG. 5 is a further elaboration of the circuit of FIG. 3B. Also in this case cascoding can be applied.

The amplifier circuit of FIG. 5 differs from the amplifier circuit of FIG. 3B in that, in addition to the elements included therein ($R_{R1}$ being replaced by $R_{R1}^1$), it further comprises an impedance network 71. Further, a diode 46 and a capacitor element $C_3$ are present. An emitter terminal of the transistor $T_8$ is coupled to the terminal 6 of the amplifier circuit via the impedance network 71, as well as to an output terminal of the current source 36. The collector terminal of the transistor $T_8$ is coupled to a terminal of the load impedance $R_{l1}'$. From the Figure, it appears that the reference point 10 in FIG. 3B has now become the reference point 10', which has the same potential as the point 13 of constant potential, i.e., ground.

The base terminal of the transistor $T_{l1}$ is coupled via the diode 46 to the point 13 of constant potential. The base terminal of the transistor $T_8$ is coupled to the first point 13 of constant potential via the capacitor element $C_3$.

Signal currents $I_s$ generated by the MR element $R_{m1}$ flow from the MR element to the terminal 7, via the transistor $T_1$, the impedance network 71 and the transistor $T_8$ to the load impedance $R_{l1}^1$, the terminals 48,48' now forming the output terminal of the arrangement. The capacitor element $C_3$ filters out a noise component that would otherwise be present in the output signal at the output terminal 48,48'.

It should be noted that the embodiments of the FIGS. 3A, 3B, 4A and 4B, where the output 8,8' of the amplifier circuit is connected to the terminals of the load impedance $R_{l1}$, are particularly suitable for use in an arrangement provided with only one MR element $R_{m1}$. The embodiment of FIG. 5, where the output of the amplifier circuit is formed by the terminals 48,48' is particularly useful in an arrangement having two MR elements $R_{m1}$ and $R_{m2}$.

It should be further noted that the circuits of the FIGS. 3A, 3B, 4A and 4B could have been provided with a load impedance $R_{l1}'$ coupled between the collector of the transistor $T_8$ and the point 13 of constant potential, which is preferred for an arrangement having two MR elements.

Figure 6:
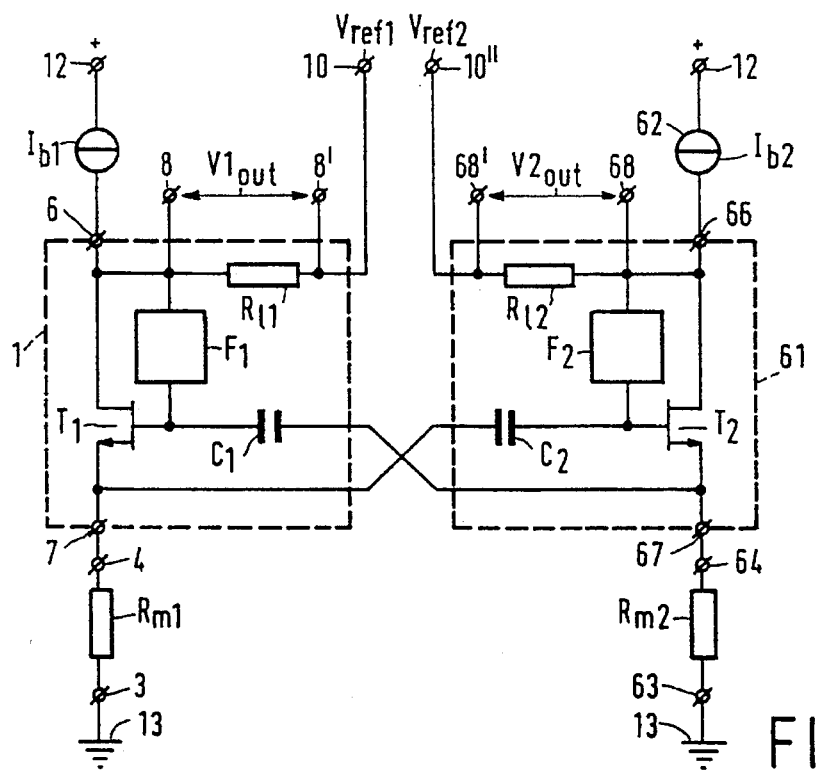
FIG. 6 shows a balanced arrangement according to the invention.

In arrangements provided with two MR elements $R_{m1}$ and $R_{m2}$, see the arrangement of FIG. 6, each MR element is coupled to an amplifier circuit of a type as described above. The output of such an arrangement is then formed by the terminals 48 of each of the two amplifier circuits.

FIG. 6 shows an embodiment of an arrangement which is in the form of a balanced circuit, and comprises two MR elements. The arrangement comprises a read head having a first and a second magneto-resistive element $R_{m1}$ and $R_{m2}$, respectively. Both MR elements $R_{m1}$ and $R_{m2}$ of the head scan the same track (not shown), so that they read the same signal from the track. The left hand part of the circuit shown in FIG. 6 is largely identical to the circuit diagram shown in FIG. 1.

A first terminal 63 of the MR element $R_{m2}$ is connected to the point 13 of constant potential (ground). Further, a second bias-current generator 62 is available, having an output for supplying a second bias current ($I_{b2}$). Another terminal of the bias-current generator 62 is coupled to the terminal 12, on which the positive supply voltage is available. The amplifier circuit 61 has a first terminal 66 coupled to the output of the second bias-current generator 62 and a second terminal 67 coupled to the second terminal 64 of the second magneto-resistive element $R_{m2}$. The second bias-current generator 62, the second amplifier circuit 61 and the second magneto-resistive element $R_{m2}$ form a series arrangement between the terminals 12 and 13.

The second amplifier circuit 61 comprises a transistor $T_2$, which is in the form of a MOS transistor, a load impedance $R_{l2}$, a feedback circuit $F_2$ and a capacitor element $C_2$. The source terminal of the transistor $T_2$ is coupled to the second terminal 67 of the amplifier circuit 61. The drain terminal of the transistor $T_2$ is coupled to the first terminal 66 of the amplifier circuit 61. The gate terminal of the transistor $T_2$ is coupled to the first terminal 66 of the amplifier circuit 61, via the feedback circuit $F_2$. Further, the gate terminal of the transistor $T_2$ is coupled to the source terminal of the transistor $T_1$ via the second capacitor element $C_2$. In addition, the gate terminal of the transistor $T_1$ is coupled to the source terminal of the transistor $T_2$ via the capacitor element $C_1$. It is also possible, however, to couple both capacitor elements to the point 13 of constant potential (ground). Nevertheless, the cross-coupled connection of the capacitor elements, as shown in FIG. 6, is preferred as it reduces the noise. A load impedance $R_{12}$ is coupled between the terminal 66 of the amplifier circuit 61 and a reference point 10", on which point a reference voltage $V_{ref2}$ is available. The voltage $V_{ref2}$ may differ from the voltage $V_{ref1}$, as the DC voltages across the MR elements $R_{m1}$ and $R_{m2}$ can be different owing to mismatch of the resistance of the MR elements and/or unequal MR bias currents $I_{b1}$ and $I_{b2}$.

Constructions similar to the feedback circuits of the FIGS. 2A, 2B or 2C can be used for the feedback circuit $F_2$ of FIG. 6. It will further be clear that the amplifier circuits as shown in the FIGS. 3A, 3B, 4A, 4B and 5 can be used for the amplifier circuit 61 of FIG. 6.

It has been said previously that the two MR elements read a signal from the same track. When the two output signals $V_{1out}$ and $V_{2out}$ are added, an output signal which is the sum of both signals will appear, and systematic DC offset in both amplifier circuits 1 and 61 will cancel. This systematic DC offset is for example the term $V_{ch1} - V_{ch2}$ between the nodes 6 and 10 (FIG. 3A), discussed previously, or the DC voltage across the grounded load resistors, such as $R_{l1}'$ in FIG. 5.

Figure 7:
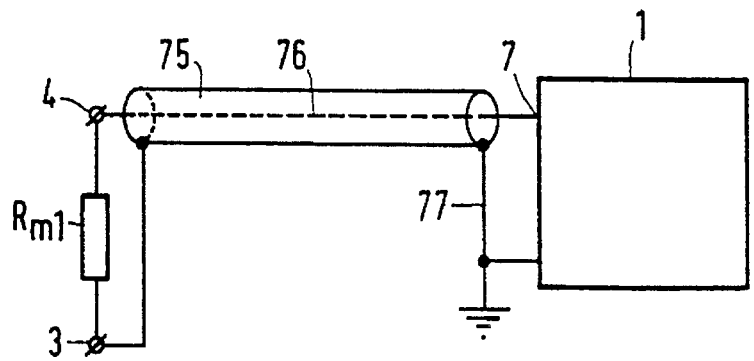
FIG. 7 shows an arrangement having shielding means provided over the electrical connection between the MR element and the amplifier circuit.

FIG. 7 shows a further improvement of the arrangement having only one MR element. FIG. 7 shows the provision of an electro-magnetic shielding 75 over the electrical connection 76 connecting the terminal 4 of the MR element $R_{m1}$ with the terminal 7 of the amplifier circuit 1. The shielding 75 is connected to ground via the electrical connection 77. This shielding prevents electro-magnetic stray fields from disturbing the signals read out by means of the head. The shielding can be realized by means of a kind of coaxial cable. However, simpler constructions can be used for the shielding means also, for instance by wrapping the ground conductor around the signal carrying conductor.

Figure 8:
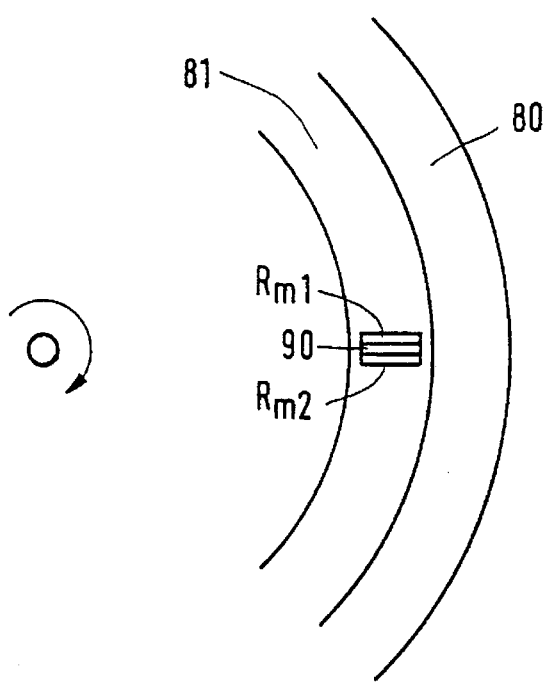
FIG. 8 shows the reading of information from a track on a disk shaped record carrier.

FIG. 8 shows a top view of the reading out of information from a track on a disk shaped record carrier 80 by means of a read head having two MR elements. Both MR elements $R_{m1}$ and $R_{m2}$ are coupled together via an insulating layer 90, and both read the full width of the same track 81.

The arrangements disclosed are preferably intended for hard disk applications, for low supply voltages, such as 3.3 V±10% and 5.0 V±10%. The bias current can be kept low, as the bias current is practically only needed for the MR element. A low-noise amplification of the signals read out can be obtained. The record carrier is preferably connected to ground via an electrical connection.

Figure 9A:
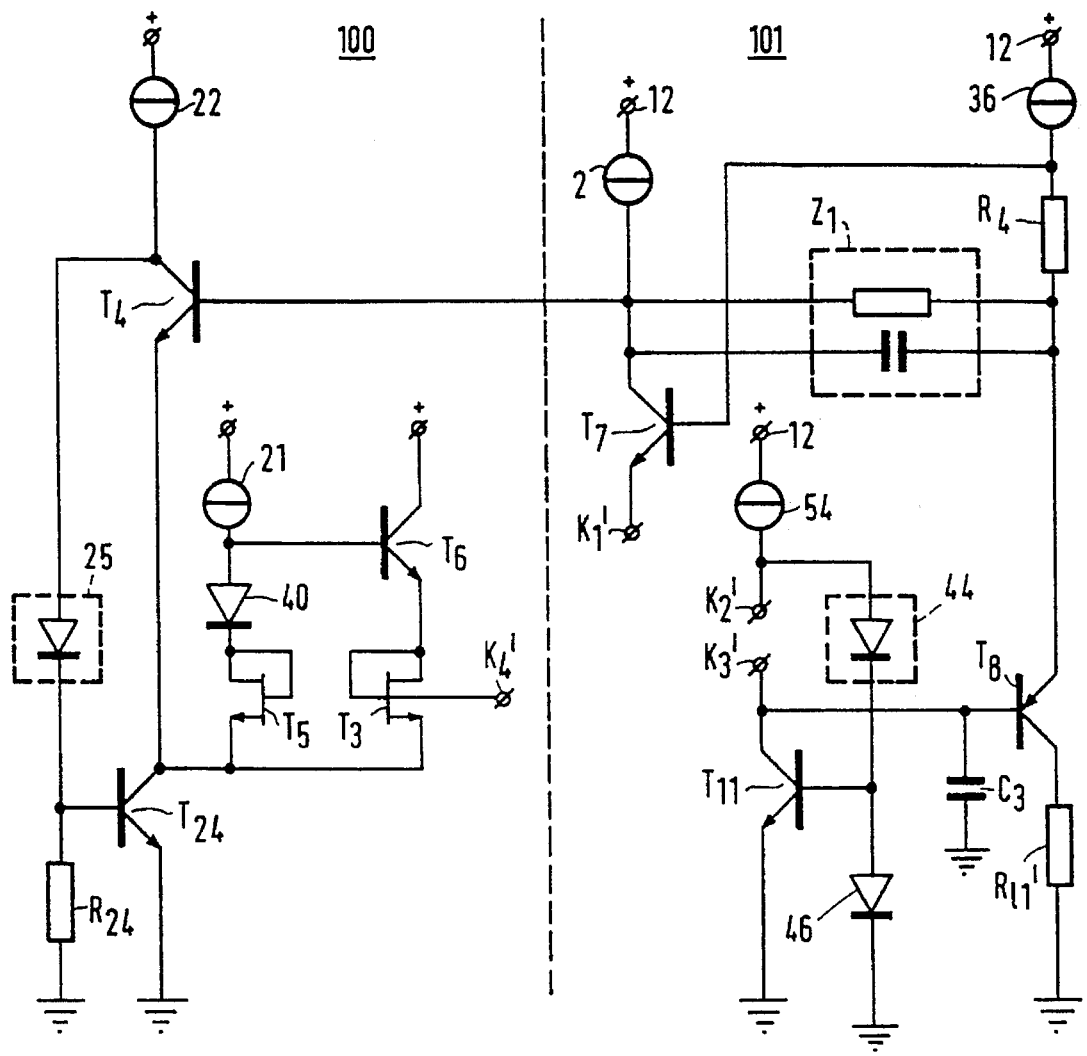
FIGS. 9A and 9B show circuit parts that can be coupled together so as to realize a multiplexed read out by means of two or more separate MR elements.
Figure 9B:
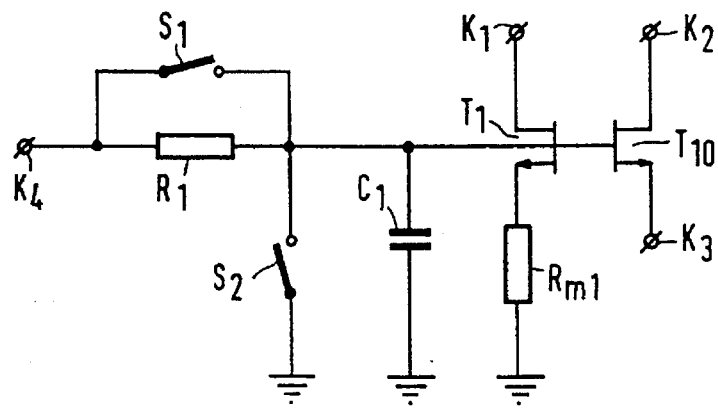

FIGS. 9A and 9B show units that can be coupled together in order to realize a multiplexed read out of information from a track on a record carrier by means of two or more MR elements. FIG. 9A shows the circuit part which is common to all MR elements, and FIG. 9B shows the circuit part for each MR element. Only one such circuit part for the MR element $R_{m1}$ is shown. For other MR elements, the circuit part of FIG. 9B should be copied. The common circuit part of FIG. 9A shows at the left side of the vertical broken line a circuit part indicated by the reference numeral 100, which circuit part is largely resembles the feedback circuit of FIG. 2C. It lacks the resistor $R_1$ and the switch $S_1$, which are included in the circuit part shown in FIG. 9B. At the right hand side of the broken line, the circuit part 101 largely resembles the amplifier circuits of FIGS. 4A and 5.

Two or more of the circuits of FIG. 9B can be coupled to the common circuit of FIG. 9A by interconnecting the terminal $k_1'$ of the common circuit of FIG. 9A with the terminals $k_1$ of the two or more circuit parts of FIG. 9B. In the same way the terminals $k_2$ and $k_2'$, $k_3$ and $k_3'$, and $k_4$ and $k_4'$ are interconnected. Multiplexing is realized by means of the switches $S_2$ in each of the circuits of FIG. 9B. One of the switches $S_2$ of one of the circuits of FIG. 9B coupled to the common circuit of FIG. 9A, is opened and the switches $S_2$ of the other circuits of FIG. 9B are closed. In that situation, all of the MR elements $R_{m1}$ are switched off except one, so that the signal read by that MR element is applied to and amplified by the circuit part of FIG. 9A.

Figure 10:
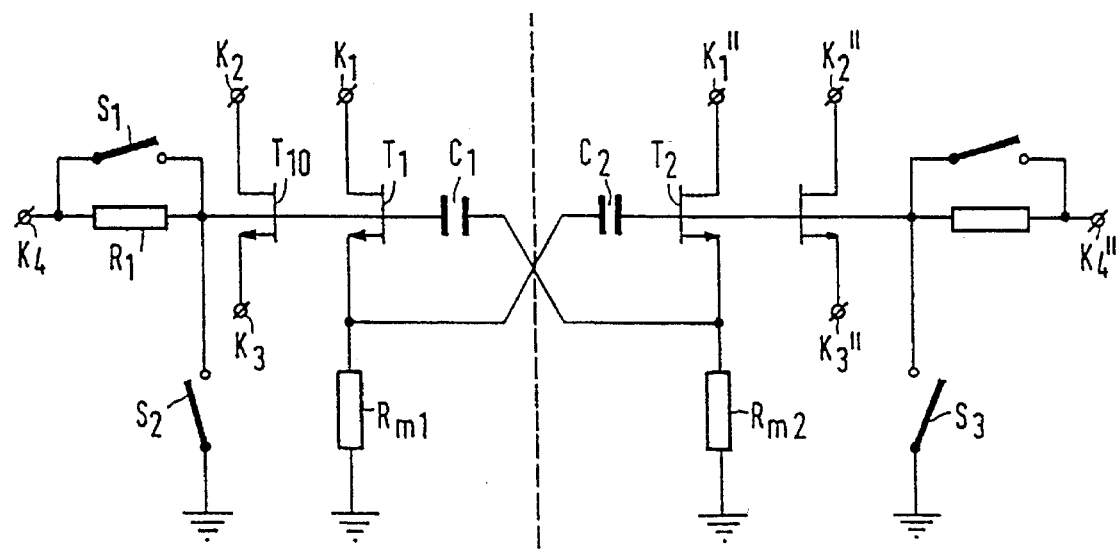
FIG. 10 shows the circuit part for realizing a multiplexed read out by means of two or more separate heads, each head having two MR elements.

FIG. 10 shows the circuit part of a balanced version of the head, comprising two MR elements $R_{m1}$ and $R_{m2}$, in a fashion as shown in FIG. 6, where multiplexing is made possible. FIG. 10 shows the circuit part including the two MR elements that is separate for each of the heads comprising two MR elements. The circuit part is largely mirror symmetrical, where the left hand part, left from the vertical broken line in FIG. 10, is the same as the circuit part of FIG. 9B. The circuit part of the transistors $T_1$ and $T_2$ and the capacitors $C_1$ and $C_2$ is identical to the corresponding circuit part of those elements in FIG. 6.

The circuit part of FIG. 9A is doubled, so as to obtain the common circuit part for each of the heads. The circuit part of FIG. 9A is thus coupled to the left hand part of the circuit of FIG. 10, as has been explained above for the interconnection between the circuits of FIGS. 9A and 9B. The right hand circuit part of FIG. 10 is coupled to a circuit part identical to the circuit part of FIG. 9A. Switching the head of FIG. 10 into the circuit means that both switches $S_2$ and $S_3$ are in the open position as shown. Consequently, the corresponding switches $S_2$ and $S_3$ of the other heads coupled to the common circuit are in their closed position. Switching the head off is realized by closing both switches $S_2$ and $S_3$.

Figure 11:
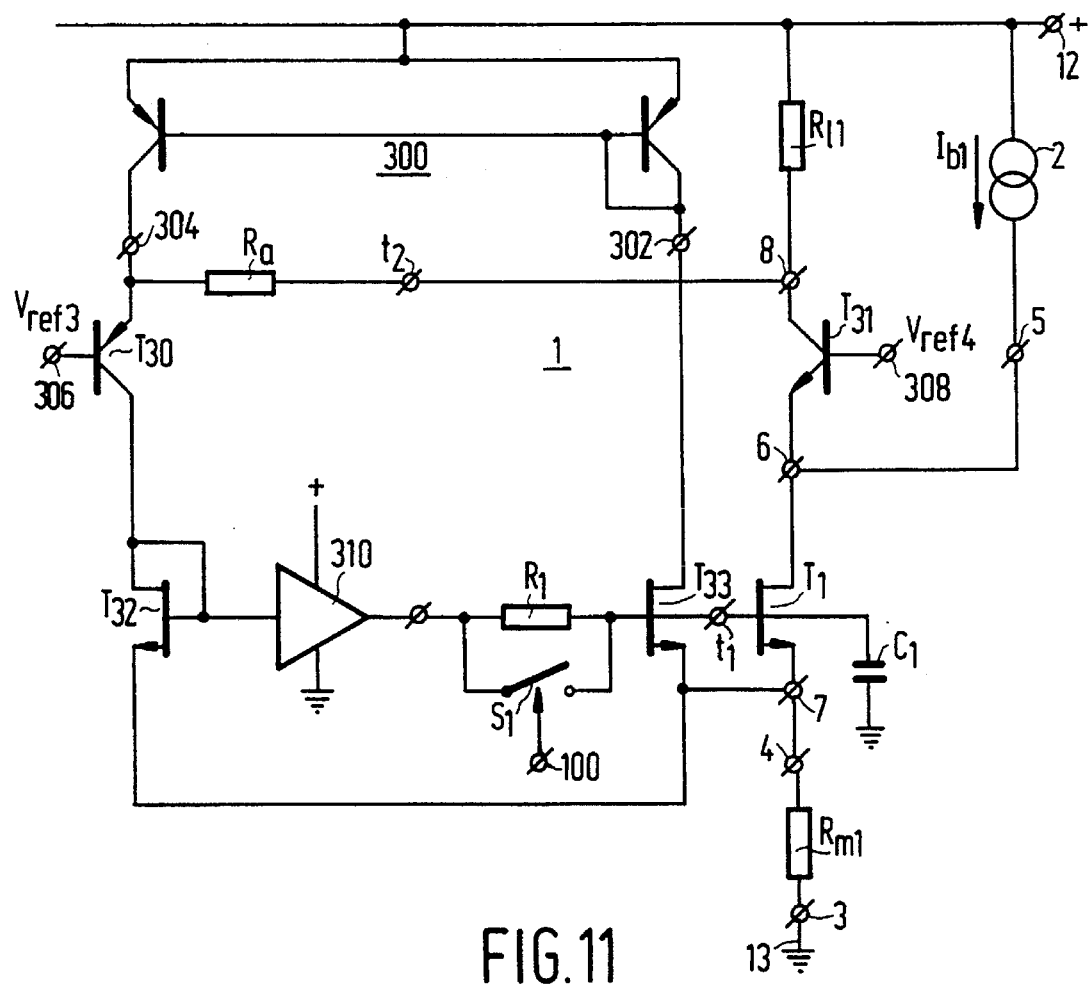
FIG. 11 shows an arrangement according to the invention.

FIG. 11 shows an alternative further-elaborated version of the amplifier circuit 1 of FIG. 1. The terminal 6 of the amplifier circuit 1 is directly connected to the output 5 of the bias current generator 2. However, in contradistinction to FIG. 1, the terminal 8, which interconnects the load impedance $R_{l1}$ and the feedback circuit $F_1$, is connected to the drain of the transistor $T_1$ via the collector-emitter path of a NPN transistor $T_{31}$. The emitter of transistor $T_{31}$ is connected to the drain of transistor $T_1$, the base of transistor $T_{31}$ is connected to a reference point 308 which supplies a reference voltage $V_{ref4}$ and the collector of transistor $T_{31}$ is coupled to the load impedance $R_{l1}$. The transistors $T_1$ and $T_{31}$ form a cascoded output stage. The collector of transistor $T_{31}$ may be connected to the load impedance $R_{l1}$ via the collector-emitter path of an optional further NPN cascode transistor (not shown). The feedback circuit $F_1$ between the terminals $t_2$, which is connected to the output terminal 8, and the terminal $t_1$, which is connected to the gate of transistor $T_1$, comprises a current mirror 300; a PNP transistor $T_{30}$, having its emitter coupled to an output terminal 304 of the current mirror 300 and its base connected to a reference voltage terminal 306 to receive a reference voltage $V_{ref3}$; a series resistor $R_a$ connected between the emitter of the transistor $T_{30}$ and the output terminal 8 of the amplifier circuit 1; a diode connected transistor $T_{32}$ of the same type as transistor $T_1$, having its source connected to the source of transistor $T_1$ and its drain coupled to the collector of transistor $T_{30}$; a transistor $T_{33}$, also of the same type as transistor $T_1$, having its gate and source connected to the gate and source of the transistor $T_1$ and its drain coupled to an input terminal 302 of the current mirror 300; a voltage following buffer amplifier 310, having an input connected to the gate of transistor $T_{32}$; a high-ohmic series resistor $R_1$ connected between an output of the buffer amplifier 310 and the gate of transistor $T_1$; and a controllable switch $S_1$ connected in parallel with the series resistor $R_1$.

The resistance of resistor $R_1$ is typically 1 MOhm, and the capacitance of the capacitor $C_1$ is typically 200 pF, values that can be integrated. The bias current generator 2 can be implemented with a programmable current output digital to analog converter (IDAC) for supplying the bias current of the magneto-resistive element $R_{m1}$. In the arrangement of FIG. 11, the IDAC supplies the variable part of the MR element's bias current, for instance 0 mA to 15.5 mA in steps of 0.5 mA, whereas a fixed current, for example 5 mA, is provided by the low-ohmic cascode output stage $T_{31}$. In order to obtain low noise, transistor $T_1$ should be large. The advantages of the cascoding arrangement are: (1) the large low-noise MOS transistor $T_1$ and the IDAC can have a low output impedance, since they feed their respective currents into a very low-ohmic emitter of the cascode transistor $T_{31}$; (2) the drain-to-gate capacitance of the large transistor $T_1$ is not Millered; (3) the IDAC provides lower bias current and a corresponding lower noise; and (4) the IDAC feeds its current to a low voltage node, which permits a high voltage drop across the IDAC which results in a further reduction of noise.

The transistors $T_{32}$ and $T_{33}$ are small with respect to transistor $T_1$, but are of the same type. The gate-source voltage of transistor $T_1$ is copied to transistor $T_{32}$ by means of transistor $T_{33}$ and current mirror 300. Therefore, on both sides of resistor $R_1$ the DC voltages with respect to ground are substantially equal. During settling, a suitable control signal closes the switch $S_1$ across resistor $R_1$ and buffer amplifier 310 provides the high charge or discharge current for recharging capacitor $C_1$. Only passive components, i.e., the resistor $R_1$, are short circuited during settling.

After settling, the current in resistor $R_1$ is zero. The current in resistor $R_a$ is zero as well, because any current through resistor $R_a$ is counteracted by an increased or decreased current through transistor $T_1$ until the current through resistor $R_a$ is zero. The voltage at the output terminal 8 is equal to the reference voltage $V_{ref3}$ at the base of transistor $T_{30}$ plus the base-emitter voltage $V_{be}$ of transistor $T_{30}$. The voltage drop across the load resistor $R_{l1}$ is thus equal to $V_{cc} - D - V_{ref3}$. This means that the fixed part of the bias current through the MR element can be adjusted by means of the reference voltage $V_{ref3}$.

Figure 12:
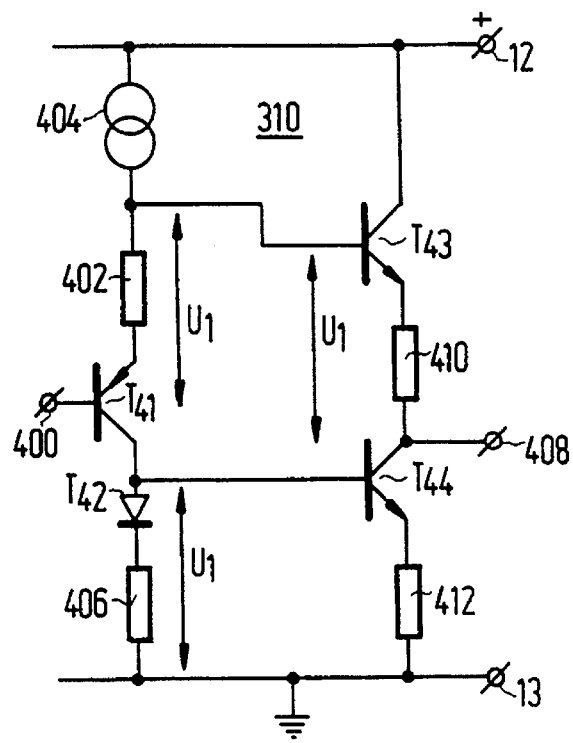
FIG. 12 shoes a voltage follower for use in the arrangement of FIG. 11.

FIG. 12 shows an example of a voltage follower 310 for use in the arrangement of FIG. 11. The input 400 of the follower 310 is connected to the base of a PNP transistor $T_{41}$. The emitter of this transistor is coupled to the point 12 of constant potential via the series arrangement of a resistor 402 and a bias current source 404. The collector of transistor $T_{41}$ is connected to point 13 (ground) via a series arrangement of a diode connected PNP transistor $T_{42}$ and a resistor 406. The resistors 402 and 406 have equal resistances. The transistors $T_{41}$ and $T_{42}$ have equal emitter areas. So in steady state the voltage drop $U_1$ caused by current source 404 across the series arrangement of the base-emitter junction of transistor $T_{41}$ and resistor 402 is equal to the voltage drop across the series arrangement of the diode connected transistor $T_{42}$ and resistor 406. The interconnection node of the current source 404 and the resistor 402 is connected to the base of a NPN transistor $T_{43}$. The collector of this transistor is coupled to point 12, and the emitter is connected to the output 408 of the follower 310 via a resistor 410. The interconnection node of the collector of transistor $T_{41}$ and the series connection of transistor $T_{42}$ and resistor 406 is connected to the base of a NPN transistor $T_{44}$, the collector of which is connected to the output 408 and the emitter of which is connected to ground via a resistor 412. The resistors 410 and 412 have equal resistances, and the transistors $T_{43}$ and $T_{44}$ have equal dimensions. In steady state, the voltage drop $U_1$ across the series arrangement of the base-emitter junction of transistor $T_{44}$ and resistor 412 is equal to the voltage drop across the series arrangement of the base-emitter junction of transistor $T_{43}$ and resistor 410.

After settling, when no current flows into the output 408, the voltage difference between the input 400 and the output 408 is zero. During settling, high charge currents can be provided to the output 408 by transistor $T_{43}$ or high discharge currents by transistor $T_{44}$ by selecting suitable low resistance values for the resistors 410 and 412. Therefore, the voltage follower of FIG. 12 enables fast and accurate settling as it provides high recharge currents during settling and low offset between input and output after settling.

The switch $S_1$ in the arrangement shown in FIG. 11 can be implemented conventionally with a MOS transistor. This, however, results in an inaccuracy caused by charge injection of the switch $S_1$ into the capacitor $C_1$. After fast settling is finished, the switch $S_1$ is opened and some capacitive charge is extracted from capacitor $C_1$. This charge is about equal to half the charge in the channel of the MOS transistor. This charge extraction can be compensated for by connecting a small additional capacitor between capacitor $C_1$ and point 12 when the switch $S_1$ is opened. However, this causes crosstalk from the supply voltage to the capacitor $C_1$.

Figure 13:
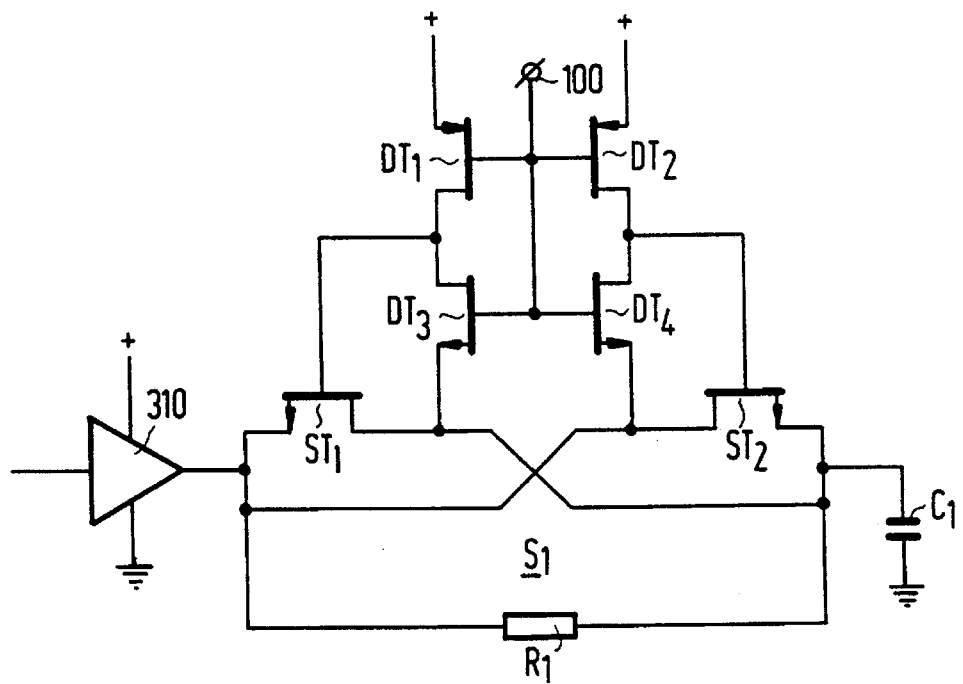
FIG. 13 shows a transistor switch for use in an arrangement according to the invention.

FIG. 13 shows a MOS switching arrangement $S_1$ which feeds half of the channel charge back to capacitor $C_1$ and compensates for the charge extraction from capacitor $C_1$. The switch $S_1$ is composed of first, $ST_1$, and second, $ST_2$, NMOS switching transistors. The source of the first switching transistor $ST_1$ is connected to the drain of the second switching transistor $ST_2$, and the drain of the first switching transistor $ST_1$ is connected to the source of the second switching transistor $ST_2$. The switching transistors $ST_1$ and $ST_2$ are driven by first, $DT_1$, and second, $DT_2$, PMOS driver transistors. These PMOS transistors have sources connected to the point 12 and gates connected to the control input 100 for receiving a control signal. The drain of the first driver transistor $DT_1$ is connected to the gate of the first switching transistor $ST_1$, and the drain of the second driver transistor $DT_2$ is connected to the gate of the second switching transistor $ST_2$. Further, third $DT_3$ and fourth $DT_4$ NMOS driver transistors are provided. These NMOS driver transistors have their gates connected to the control input 100, whereas the source of the third driver transistor $DT_3$ is connected to the drain of the first switching transistor $ST_1$, the source of the fourth driver transistor $DT_4$ is connected to the drain of the second switching transistor $ST_2$, the drain of the third driver transistor $DT_3$ is connected to the drain of the first driver transistor $DT_1$, and the drain of the fourth driver transistor $DT_4$ is connected to the drain of the second driver transistor $DT_2$.

If the control signal at control terminal 100 is low (ground), then the PMOS driver transistors $DT_1$ and $DT_2$ are conductive and switch on the switching transistors $ST_1$ and $ST_2$, and a resistor $R_1$, which couples the sources of the first and second switching transistors $ST_1$ and $ST_2$ together, is short-circuited for fast settling. The settling is finished by applying a high voltage at the control terminal 100. In that case, the PMOS driver transistors $DT_1$ and $DT_2$ are cut off, and the NMOS driver transistors $DT_3$ and $DT_4$ are made conductive. The conductive driver transistor $DT_3$ provides a conduction path from the gate of the switching transistor $ST_1$ to the capacitor $C_1$ and allows half the channel charge of switching transistor $ST_1$ to flow into the capacitor $C_1$, thereby cancelling the half of the channel charge of switching transistor $ST_2$ which is extracted from the capacitor $C_1$. The other half of the channel charge of switching transistor $ST_2$ is conducted by driver transistor $DT_4$ to the low-ohmic output of buffer 310, which also absorbs the other half of the channel charge of switching transistor $ST_1$. It will be clear that the switching arrangement of FIG. 12 can also be employed in the above mentioned embodiments.

Figure 14:
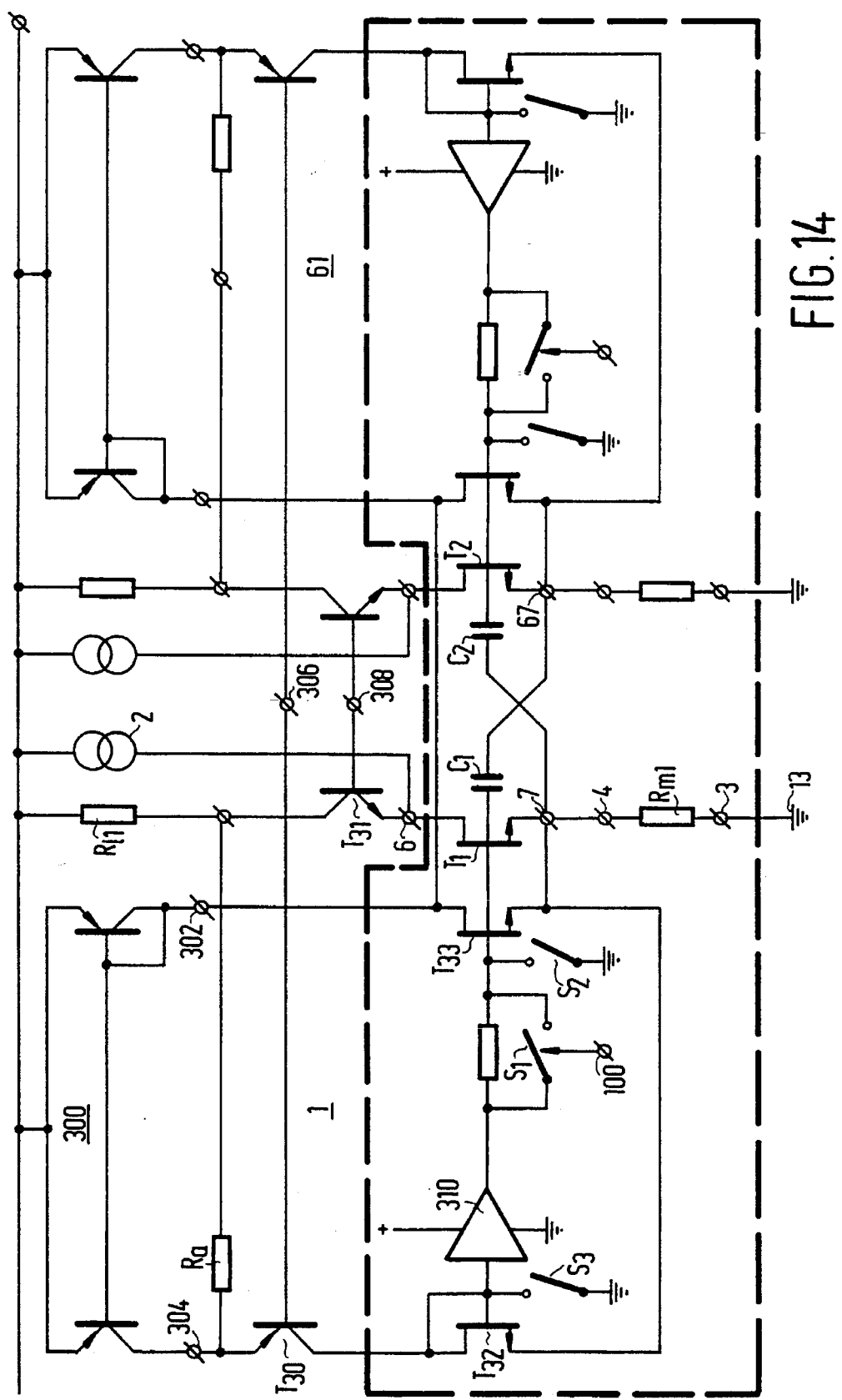
FIG. 14 shows an embodiment of a balanced arrangement according to the invention.

FIG. 14 shows a balanced version of the arrangement of FIG. 11. The two amplifiers 1 and 61, in particular, the capacitors $C_1$ of the first amplifier 1 and the corresponding capacitor $C_2$ of the second amplifier 61, are interconnected in a similar fashion as shown in FIG. 6. At high frequencies, the capacitors $C_1$ and $C_2$ form a short circuit and shunt the two individual equivalent source noise resistors $R_n$ of the MOS transistors $T_1$ and $T_2$. $R_n$ is about equal to $R_o$, $R_o$ being the inverse of the transconductance of the transistors $T_1$ and $T_2$. The total effective noise resistance in the first amplifier 1 of the arrangement of FIG. 14 is $R_{m1}+R_n/2$ instead of $R_{m1}+R_n$ of the first amplifier 1 of the arrangement of FIG. 11. The balanced version thus provides a reduction of noise.

One of the MR elements $R_{m1}$ or $R_{m2}$ may be omitted when using single strip MR read heads. In that case, terminal 7 or 67 is coupled to ground 13. The input terminals of the current mirrors may be advantageously interconnected to cancel signal components.

In order to enable switching of heads, two further switches are provided in each half of the balanced arrangement. One further switch $S_2$ for connecting the gate of transistor $T_1$ to ground and a second parallel-operated further switch $S_3$ for connecting the gate of transistor $T_{32}$ to ground. In the other amplifier 61, similar switches are provided which are operated simultaneously with switches $S_2$ and $S_3$. Elements which have to be duplicated for each dual read head are enclosed by a dashed line in FIG. 14. The remainder of the balanced arrangement is common to all dual read heads. A dual read head is disabled by closing the switches $S_3$ and $S_4$ in both parts of the balanced arrangement. Fast settling is obtained by closing the switches $S_1$ temporarily.

In the embodiments shown in the Figures, certain transistors, for example the transistors $T_1$, $T_2$, $T_3$, $T_5$ and $T_{10}$ are preferably unipolar MOS transistors; other transistors, such as the transistors $T_4$, $T_{24}$, $T_6$, $T_7$, $T_8$, $T_9$, $T_{11}$ and $T_{31}$, are preferably bipolar transistors. It is, however, possible to use bipolar transistors instead of unipolar transistors and vice versa, or to use only bipolar or only unipolar transistors. The first main flow terminal, the second main flow terminal and the control terminal of a transistor correspond to, respectively, the source terminal, the drain terminal and the gate terminal of an unipolar transistor and to, respectively, the emitter terminal, the collector terminal and the base terminal of a bipolar transistor.

We claim:

1. An arrangement for reading out an information signal from a magnetic record carrier, comprising:

a read head including a magneto-resistive element having a first terminal connected to a first point of constant potential, and a second terminal;

bias-current means for supplying a bias-current, the bias-current means having a first terminal coupled to a second point of constant potential, and a second terminal; and an amplifier circuit having an output terminal for supplying the information signal, a first terminal coupled to the second terminal of the bias-current means and to the output terminal, and a second terminal coupled to the second terminal of the magneto-resistive element, whereby the bias-current means, the amplifier circuit and the magneto-resistive element are in series with one another in that order between the second point of constant potential and the first point of constant potential;

wherein the first terminal of the amplifier circuit is coupled to the output terminal of the amplifier circuit, and the amplifier circuit includes:

a feedback circuit ($F_1$) having an input terminal coupled to the output terminal of the amplifier circuit, and an output terminal;

a capacitor element;

a first transistor having a first main flow terminal connected to the second terminal of the amplifier circuit, a second main flow terminal coupled to the first terminal of the amplifier circuit, and a control terminal coupled to the output terminal of the feedback circuit and to the first point of constant potential via at least the capacitor element; and a load impedance coupled to the output terminal of the amplifier circuit;

wherein the feedback circuit includes:

a voltage buffer having an input coupled to the input terminal of the feedback circuit, and an output;

a first series resistor connected between the output of the voltage buffer and the output terminal of the feedback circuit; and a switch connected in parallel with the first series resistor and operable in response to a control signal.

2. The arrangement as claimed in claim 1, wherein the voltage buffer includes a first current source, a second current source, a second transistor and a third transistor, a first main flow terminal of the second transistor and a first main flow terminal of the third transistor being interconnected and coupled to the first point of constant potential via the first current source, a second main flow terminal of the second transistor being connected to a control terminal of the second transistor and coupled to the second point of constant potential via the second current source and forming the output of the voltage buffer, a second main flow terminal of the third transistor being coupled to the second point of constant potential, and a control terminal of the third transistor ($T_4$) forming the input of the voltage buffer.

3. The arrangement as claimed in claim 2, wherein the voltage buffer further includes a third current source connected between the second main flow terminal of the third transistor and the second point of constant potential; and the first current source includes a diode arrangement, a bias resistor, and a fourth transistor having a first main flow terminal connected to the first point of constant potential, a second main flow terminal connected to the first main flow terminals of the second and third transistors, and a control terminal coupled to the second main flow terminal of the third transistor via the diode arrangement and to the first point of constant potential via the bias resistor.

4. The arrangement as claimed in claim 3, wherein the voltage buffer further includes a diode element; a fifth transistor having a control terminal and a second main flow terminal interconnected and coupled to the second current source via the diode element, and a first main flow terminal connected to the first main flow terminal of the second transistor; and a sixth transistor having a first main flow terminal coupled to the second main flow terminal of the second transistor, a second main flow terminal coupled to the second point of constant potential, and a control terminal coupled to the second main flow terminal of the fifth transistor via the diode element.

5. The arrangement as claimed in claim 4, wherein the amplifier circuit further includes a seventh transistor having a first main flow terminal connected to the second main flow terminal of the first transistor, and a second main flow terminal coupled to the first terminal of the amplifier circuit.

6. The arrangement as claimed in claim 5, wherein the amplifier circuit further includes a bias-current source, and an eighth transistor having a control terminal coupled to the second terminal of the amplifier circuit, a first main flow terminal coupled to the second point of constant potential via the bias-current source, and a second main flow terminal coupled to the first point of constant potential; and wherein the load impedance is coupled between the output terminal of the amplifier circuit and the first main flow terminal of the eighth transistor.

7. The arrangement as claimed in claim 6, wherein the amplifier circuit further includes a ninth transistor having a first main flow terminal coupled to a control terminal of the seventh transistor, and a control terminal coupled to the first main flow terminal of the eighth transistor.

8. The arrangement as claimed in claim 2, wherein the switch includes:

first and second switching transistors of a first coductivity type, a first main flow terminal of the first switching transistor being connected to a second main flow terminal of the second switching transistor, and a second main flow terminal of the first switching transistor being connected to a first main flow terminal of the second switching transistor;

first and second driver transistors of a second conductivity type, first main flow terminals of the first and second driver transistors being connected to a supply voltage terminal, control terminals of the first and second driver transistors being connected to a control input for receiving the control signal, a second main flow terminal of the first driver transistor being connected to a control terminal of the first switching transistor, and a second main flow terminal of the second driver transistor being connected to a control terminal of the second switching transistor; and third and fourth driver transistors of the first conductivity type, control terminals of the third and fourth driver transistors being connected to the control input, a first main flow terminal of the third driver transistor being connected to the second main flow terminal of the first switching transistor, a first main flow terminal of the fourth driver transistor being connected to the second main flow terminal of the second switching transistor, a second main flow terminal of the third driver transistor being connected to the second main flow terminal of the first driver transistor, and a second main flow terminal of the fourth driver transistor being connected to the second main flow terminal of the second driver transistor.

9. The arrangement as claimed in claim 2 in combination with a second arrangement which is substantially the same as the arrangement as claimed in claim 2, wherein the capacitor element of the amplifier circuit of the arrangement is coupled to the second terminal of the amplifier circuit of the second arrangement, and the capacitor element of the amplifier circuit of the second arrangement is coupled to the second terminal of the amplifier circuit of the arrangement.

10. The arrangement as claimed in claim 1, further comprises a second transistor which couples the first terminal of the amplifier circuit to the output terminal of the amplifier circuit, the second transistor having a first main flow terminal connected to the first terminal of the amplifier circuit, and a second main flow terminal coupled to the output terminal of the amplifier circuit; and wherein voltage buffer includes:

a current mirror having an input terminal, and an output terminal;

a third transistor having a conductivity which is opposite to the conductivity of the second transistor, a first main flow terminal coupled to the output terminal of the current mirror, and a control terminal connected to receive a reference voltage;

a second series resistor connected between the first main flow terminal of the third transistor and the output terminal of the amplifier circuit;

a fourth transistor, of the same type as the first transistor, having a first main flow terminal connected to the first main flow terminal of the first transistor, and a second main flow terminal and a control terminal interconnected and coupled to a second main flow terminal of the third transistor;

a fifth transistor, of the same type as the first transistor, having a control terminal and a first main flow terminal connected to the corresponding terminals of the first transistor, and a second main flow terminal coupled to the input terminal (302) of the current mirror; and a buffer amplifier having an input connected to the control terminal of the fourth transistor, and an output connected to the first series resistor ($R_1$).

11. The arrangement as claimed in claim 10, wherein the bias-current means includes a bias-current generator having an output connected to the first terminal of the amplifier circuit.

12. The arrangement as claimed in claim 10, wherein the switch includes:

first and second switching transistors of a first coductivity type, a first main flow terminal of the first switching transistor being connected to a second main flow terminal of the second switching transistor, and a second main flow terminal of the first switching transistor being connected to a first main flow terminal of the second switching transistor;

first and second driver transistors of a second conductivity type, first main flow terminals of the first and second driver transistors being connected to a supply voltage terminal, control terminals of the first and second driver transistors being connected to a control input for receiving the control signal, a second main flow terminal of the first driver transistor being connected to a control terminal of the first switching transistor, and a second main flow terminal of the second driver transistor being connected to a control terminal of the second switching transistor; and third and fourth driver transistors of the first conductivity type, control terminals of the third and fourth driver transistors being connected to the control input, a first main flow terminal of the third driver transistor being connected to the second main flow terminal of the first switching transistor, a first main flow terminal of the fourth driver transistor being connected to the second main flow terminal of the second switching transistor, a second main flow terminal of the third driver transistor being connected to the second main flow terminal of the first driver transistor, and a second main flow terminal of the fourth driver transistor being connected to the second main flow terminal of the second driver transistor.

13. The arrangement as claimed in claim 10 in combination with a second arrangement which is substantially the same as the arrangement as claimed in claim 10, wherein the capacitor element of the amplifier circuit of the arrangement is coupled to the second terminal of the amplifier circuit of the second arrangement, and the capacitor element of the amplifier circuit of the second arrangement is coupled to the second terminal of the amplifier circuit of the arrangement.

14. The arrangement as claimed in claim 1, wherein the switch includes:

first and second switching transistors of a first conductivity type, a first main flow terminal of the first switching transistor being connected to a second main flow terminal of the second switching transistor, and a second main flow terminal of the first switching transistor being connected to a first main flow terminal of the second switching transistor;

first and second driver transistors of a second conductivity type, first main flow terminals of the first and second driver transistors being connected to a supply voltage terminal, control terminals of the first and second driver transistors being connected to a control input for receiving the control signal, a second main flow terminal of the first driver transistor being connected to a control terminal of the first switching transistor, and a second main flow terminal of the second driver transistor being connected to a control terminal of the second switching transistor; and third and fourth driver transistors of the first conductivity type, control terminals of the third and fourth driver transistors being connected to the control input, a first main flow terminal of the third driver transistor being connected to the second main flow terminal of the first switching transistor, a first main flow terminal of the fourth driver transistor being connected to the second main flow terminal of the second switching transistor, a second main flow terminal of the third driver transistor being connected to the second main flow terminal of the first driver transistor, and a second main flow terminal of the fourth driver transistor being connected to the second main flow terminal of the second driver transistor.

15. The arrangement as claimed in claim 1 in combination with a second arrangement which is substantially the same as the arrangement as claimed in claim 1, wherein the capacitor element of the amplifier circuit of the arrangement is coupled to the second terminal of the amplifier circuit of the second arrangement, and the capacitor element of the amplifier circuit of the second arrangement is coupled to the second terminal of the amplifier circuit of the arrangement.

16. The arrangement as claimed in claim 1, wherein the amplifier circuit further includes a second transistor having a first main flow terminal connected to the second main flow terminal of the first transistor, and a second main flow terminal coupled to the first terminal of the amplifier circuit.

17. The arrangement as claimed in claim 16, wherein the amplifier circuit further includes a bias-current source, and a third transistor having a control terminal coupled to the second terminal of the amplifier circuit, a first main flow terminal coupled to the second point of constant potential via the bias-current source, and a second main flow terminal coupled to the first point of constant potential; and wherein the load impedance is coupled between the output terminal of the amplifier circuit and the first main flow terminal of the third transistor.

18. The arrangement as claimed in claim 17, wherein the amplifier circuit further includes a fourth transistor having a first main flow terminal coupled to a control terminal of the second transistor, and a control terminal coupled to the first main flow terminal of the third transistor.

19. The arrangement as claimed in claim 16, wherein the switch includes:

first and second switching transistors of a first coductivity type, a first main flow terminal of the first switching transistor being connected to a second main flow terminal of the second switching transistor, and a second main flow terminal of the first switching transistor being connected to a first main flow terminal of the second switching transistor;

first and second driver transistors of a second conductivity type, first main flow terminals of the first and second driver transistors being connected to a supply voltage terminal, control terminals of the first and second driver transistors being connected to a control input for receiving the control signal, a second main flow terminal of the first driver transistor being connected to a control terminal of the first switching transistor, and a second main flow terminal of the second driver transistor being connected to a control terminal of the second switching transistor; and third and fourth driver transistors of the first conductivity type, control terminals of the third and fourth driver transistors being connected to the control input, a first main flow terminal of the third driver transistor being connected to the second main flow terminal of the first switching transistor, a first main flow terminal of the fourth driver transistor being connected to the second main flow terminal of the second switching transistor, a second main flow terminal of the third driver transistor being connected to the second main flow terminal of the first driver transistor, and a second main flow terminal of the fourth driver transistor being connected to the second main flow terminal of the second driver transistor.

20. The arrangement as claimed in claim 16 in combination with a second arrangement which is substantially the same as the arrangement as claimed in claim 14, wherein the capacitor element of the amplifier circuit of the arrangement is coupled to the second terminal of the amplifier circuit of the second arrangement, and the capacitor element of the amplifier circuit of the second arrangement is coupled to the second terminal of the amplifier circuit of the arrangement.

21. The arrangement as claimed in claim 1, wherein the amplifier circuit further includes a bias-current source, and a second transistor having a control terminal coupled to the second terminal of the amplifier circuit, a first main flow terminal coupled to the second point of constant potential via the bias-current source, and a second main flow terminal coupled to the first point of constant potential; and wherein the load impedance is coupled between the output terminal of the amplifier circuit and the first main flow terminal of the second transistor.

22. The arrangement as claimed in claim 21, wherein the amplifier circuit further includes a third transistor having a control terminal coupled to the control terminal of the first transistor, and a first main flow terminal coupled to the control terminal of the second transistor.

23. The arrangement as claimed in claim 22, further comprising a further load impedance having a terminal for providing a further information signal, and wherein the second main flow terminal of the second transistor is coupled to the first point of constant potential via the further load impedance.

24. The arrangement as claimed in claim 21, further comprising a further load impedance having a terminal for providing a further information signal, and wherein the second main flow terminal of the second transistor is coupled to the first point of constant potential via the further load impedance.

25. The arrangement as claimed in claim 21, wherein the switch includes:

first and second switching transistors of a first coductivity type, a first main flow terminal of the first switching transistor being connected to a second main flow terminal of the second switching transistor, and a second main flow terminal of the first switching transistor being connected to a first main flow terminal of the second switching transistor;

first and second driver transistors of a second conductivity type, first main flow terminals of the first and second driver transistors being connected to a supply voltage terminal, control terminals of the first and second driver transistors being connected to a control input for receiving the control signal, a second main flow terminal of the first driver transistor being connected to a control terminal of the first switching transistor, and a second main flow terminal of the second driver transistor being connected to a control terminal of the second switching transistor; and third and fourth driver transistors of the first conductivity type, control terminals of the third and fourth driver transistors being connected to the control input, a first main flow terminal of the third driver transistor being connected to the second main flow terminal of the first switching transistor, a first main flow terminal of the fourth driver transistor being connected to the second main flow terminal of the second switching transistor, a second main flow terminal of the third driver transistor being connected to the second main flow terminal of the first driver transistor, and a second main flow terminal of the fourth driver transistor being connected to the second main flow terminal of the second driver transistor.

26. The arrangement as claimed in claim 21 in combination with a second arrangement which is substantially the same as the arrangement as claimed in claim 21, wherein the capacitor element of the amplifier circuit of the arrangement is coupled to the second terminal of the amplifier circuit of the second arrangement, and the capacitor element of the amplifier circuit of the second arrangement is coupled to the second terminal of the amplifier circuit of the arrangement.

27. An arrangement for reading out an information signal from a magnetic record carrier, comprising:

read means for reading the information signal; and an amplifier coupled to the read means and having an output terminal, the amplifier including a transistor having a control terminal, a first main flow terminal coupled to the read means, and a second main flow terminal coupled to the output terminal of the amplifier; and feedback means for providing feedback from the output terminal of the amplifier to the control terminal of the transistor, the feedback means having a cut-off capacitor, and a voltage buffer having an output terminal which is directly connectable to the cut-off capacitor in response to a control signal.

28. The arrangement as claimed in claim 27, wherein the feedback means further includes a resistor, coupled between the cut-off capacitor and the output of the voltage buffer, and a switch connected in parallel with the resistor for short-circuiting the resistor in response to the control signal.

* * * * *